United States Patent
Jin et al.

(10) Patent No.: US 8,957,419 B2
(45) Date of Patent: Feb. 17, 2015

(54) ORGANIC LIGHT EMITTING DISPLAY APPARATUS HAVING INSPECTION THIN FILM TRANSISTORS

(71) Applicants: Guang-Hai Jin, Yongin (KR); Dong-Gyu Kim, Yongin (KR); Kwan-Wook Jung, Yongin (KR); Oh-Seob Kwon, Yongin (KR); Moo-Jin Kim, Yongin (KR)

(72) Inventors: Guang-Hai Jin, Yongin (KR); Dong-Gyu Kim, Yongin (KR); Kwan-Wook Jung, Yongin (KR); Oh-Seob Kwon, Yongin (KR); Moo-Jin Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/794,935

(22) Filed: Mar. 12, 2013

(65) Prior Publication Data

US 2014/0124745 A1    May 8, 2014

(30) Foreign Application Priority Data

Nov. 8, 2012 (KR) ........................ 10-2012-0126158

(51) Int. Cl.
 *H01L 27/32* (2006.01)
 *H01L 21/66* (2006.01)
 *G09G 3/00* (2006.01)

(52) U.S. Cl.
 CPC ........ *H01L 27/3244* (2013.01); *H01L 27/3276* (2013.01); *H01L 22/34* (2013.01); *G09G 3/006* (2013.01)
 USPC ........................................................... 257/48

(58) Field of Classification Search
 CPC ...................................................... H01L 22/30
 See application file for complete search history.

(56) References Cited

U.S. PATENT DOCUMENTS

| | | | |
|---|---|---|---|
| 7,875,880 B2 * | 1/2011 | Lee ................................. | 257/40 |
| 7,956,355 B2 * | 6/2011 | Hayashi et al. ................ | 257/40 |
| 8,264,661 B2 * | 9/2012 | Jeoung et al. ................. | 349/192 |
| 2003/0156079 A1 * | 8/2003 | Nakanishi ....................... | 345/45 |
| 2007/0234151 A1 * | 10/2007 | Hsu et al. ...................... | 714/726 |

FOREIGN PATENT DOCUMENTS

| | | |
|---|---|---|
| JP | 2001-188213 A | 7/2001 |
| KR | 10-2007-0096509 A | 10/2007 |
| KR | 10-2011-0025539 A | 3/2011 |

* cited by examiner

*Primary Examiner* — Stephen W Smoot
(74) *Attorney, Agent, or Firm* — Lee & Morse, P.C.

(57) ABSTRACT

An organic light emitting display apparatus and a method of inspecting the same, the organic light emitting display apparatus including a plurality of sub-pixels; a plurality of conductive line portions connected to the sub-pixels, the plurality of conductive line portions including at least two conductive lines connected in parallel to one another; and inspection thin film transistors (TFTs) disposed adjacent to one end and both ends of at least one conductive line of the conductive lines connected in parallel to one another.

20 Claims, 6 Drawing Sheets

ORGANIC LIGHT EMITTING DISPLAY APPARATUS HAVING INSPECTION THIN FILM TRANSISTORS

CROSS-REFERENCE TO RELATED PATENT APPLICATION

This application claims the benefit of Korean Patent Application No. 10-2012-0126158, filed on Nov. 8, 2012, in the Korean Intellectual Property Office, the disclosure of which is incorporated herein in its entirety by reference.

BACKGROUND

1. Field

The embodiments relate to an organic light emitting display apparatus and a method of inspecting the same.

2. Description of the Related Art

In recent years, display devices are showing a tendency to be replaced by ultrathin flat panel display (FPD) devices. Among FPDs, an organic light emitting display apparatus, which is an emissive display device, has attracted as an advanced display device because the organic light emitting display apparatus has a wide viewing angle, a high contrast ratio, and a high response speed.

An organic light emitting display apparatus may include an intermediate layer, a first electrode, and a second electrode. The intermediate layer may include an organic emission layer (EML), and when voltages are applied to the first and second electrodes, the organic EML may generate visible light.

SUMMARY

The embodiments provide an organic light emitting display apparatus and a method of inspecting the same, by which electrical failures may be easily inspected.

According to an embodiment, there is provided an organic light emitting display apparatus including: a plurality of sub-pixels, a plurality of conductive line portions connected to the sub-pixels and including at least two conductive lines connected in parallel to one another, and inspection thin film transistors (TFTs) disposed adjacent to one end and both ends of at least one conductive line of the conductive lines connected in parallel to one another.

The plurality of conductive line portions may be scan lines.

Each of the scan lines may include a first scan line and a second scan line branched from the corresponding scan line and connected in parallel to each other.

A sub-pixel connected to the first scan line and sub-pixels connected to the second scan line may embody different colors.

Any one of the first and second scan lines may be connected to sub-pixels configured to embody one color and a sub-pixel configured to embody another color.

Each of the conductive line portions may be an emission control line configured to simultaneously transmit a control signal to the sub-pixels.

The emission control line may include a common line and parallel control lines connected to the common line and connected in parallel to one another.

The inspection TFTs may be disposed outside the sub-pixels.

Each of the sub-pixels may include a first electrode, an intermediate layer including an organic emission layer (EML), and a second electrode.

The organic light emitting display apparatus may further include a TFT connected to the first electrode and configured to apply a signal for driving the corresponding sub-pixel, and including an active layer, a gate electrode, a source electrode, and a drain electrode.

The first electrode may be formed of the same material as the gate electrode.

The first electrode may contain a transmissive conductive material.

The inspection TFTs may be controlled to be driven irrespective of the drive of the sub-pixels.

According to another embodiment, there is provided a method of inspecting an organic light emitting display apparatus. The method includes: preparing an organic light emitting display apparatus including a plurality of sub-pixels, a plurality of conductive line portions connected to the sub-pixels and including at least two conductive lines connected in parallel to one another, and inspection thin film transistors (TFTs) disposed adjacent to one end and both ends of at least one conductive line of the conductive lines connected in parallel to one another, preparing an inspection apparatus including a power supply member and a power receiving member, performing a first inspection process, the first inspection process including sequentially connecting the power supply member and the power receiving member to the respective conductive line portions, applying electric signals to the respective conductive line portions, and monitoring the respective conductive line portions to confirm a conductive line portion having a failure out of the plurality of conductive line portions, and performing a second inspection process, the second inspection process including stopping the operation of the inspection TFTs of a conductive line portion having the failure, connecting the power supply member and the power receiving member to the conductive line portion having the failure, applying an electric signal to the conductive line portion having the failure to confirm a conductive line having a failure out of the conductive lines connected in parallel to each other in the conductive line portion.

In the second inspection process, the operation of the inspection TFTs may be stopped such that the conductive line connected to the inspection TFTs of the conductive line portion having the failure remains floated.

In the first inspection process, the inspection TFTs may normally operate.

The failure of the conductive line portion may be a short failure.

The conductive line portions may be scan lines, and the failure may be a short failure between a scan line and a data line overlapping the scan line.

The conductive line portions may be emission control lines, and the failure may be a short failure between an emission control line and a scan line or power line overlapping the emission control line.

The method may further include repairing the conductive line having the failure that has been confirmed via the first and second inspection processes.

BRIEF DESCRIPTION OF THE DRAWINGS

The above and other features and advantages will become more apparent by describing in detail exemplary embodiments thereof with reference to the attached drawings in which.

DETAILED DESCRIPTION

As used herein, expressions such as "at least one of," when preceding a list of elements, modify the entire list of elements and do not modify the individual elements of the list.

The embodiments are described more fully hereinafter with reference to the accompanying drawings, in which embodiments of the invention are shown.

Figure 1:
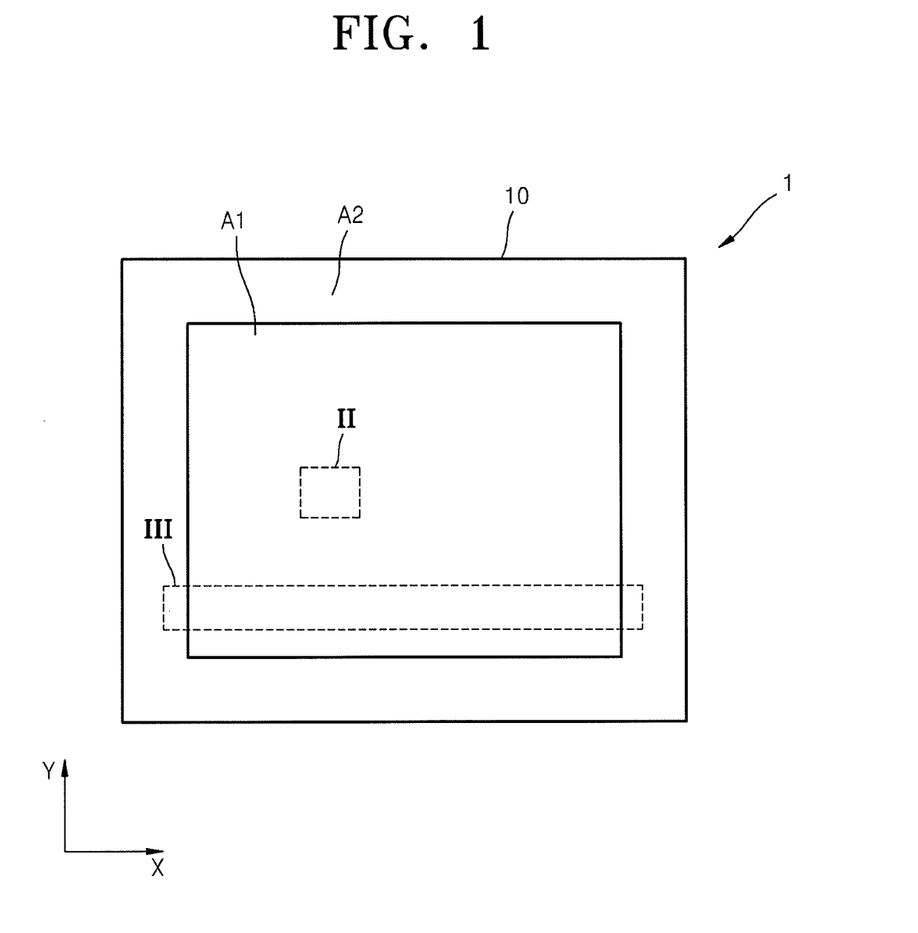
FIG. 1 illustrates a schematic plan view of an organic light emitting display apparatus according to an embodiment.
Figure 2:
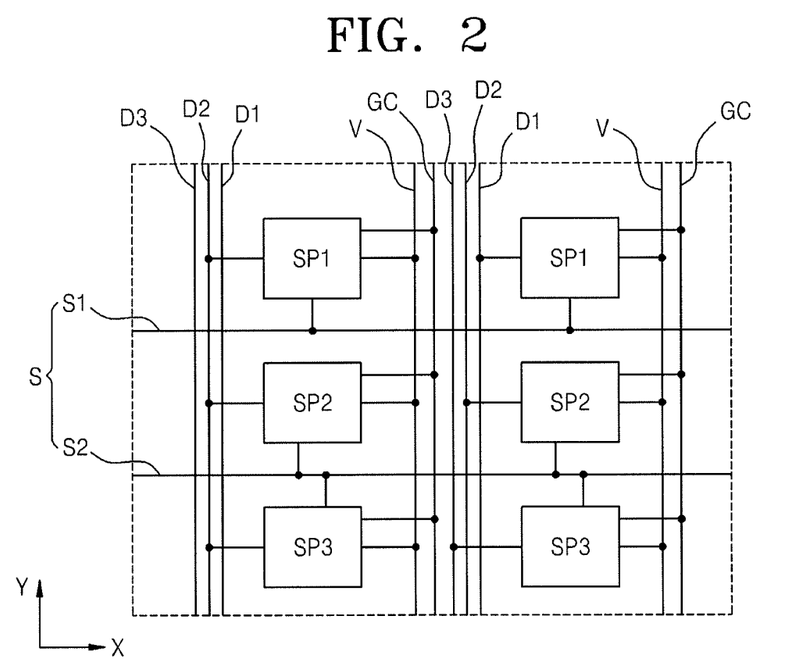
FIG. 2 illustrates a schematic diagram of an interconnection structure of a region II of FIG. 1.
Figure 3:
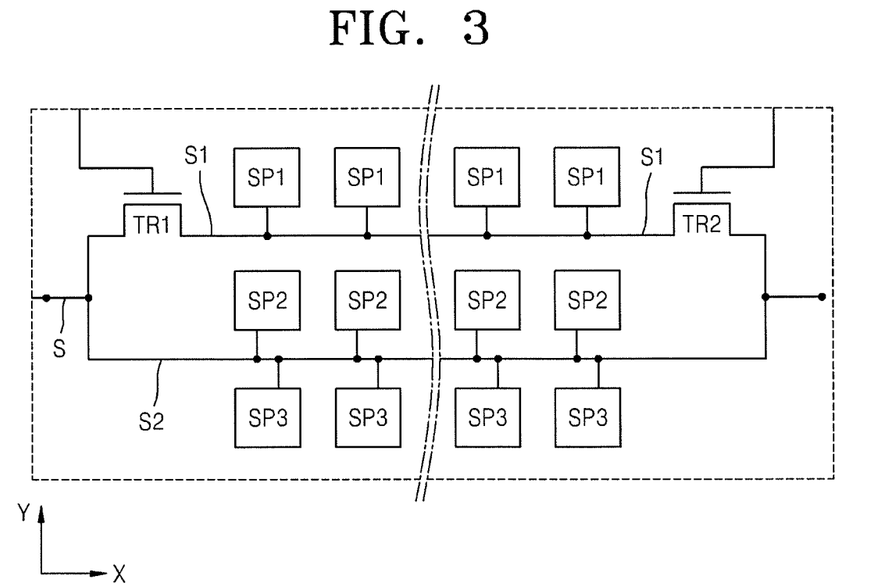
FIG. 3 illustrates a schematic diagram of an interconnection structure of a region III of FIG. 1.

FIG. 1 illustrates a schematic plan view of an organic light emitting display apparatus 1 according to an embodiment, FIG. 2 illustrates a schematic diagram of an interconnection structure of a region II of FIG. 1, and FIG. 3 illustrates a schematic diagram of an interconnection structure of a region III of FIG. 1.

Referring to FIGS. 1 and 2, the organic light emitting display apparatus 1 may include a display region A1 and a non-display region A2 formed on a substrate 10.

The display region A1, which is a region configured to display images, may be formed in a region including a center of the substrate 10, while the non-display region A2 may be disposed in a peripheral region of the display region A1.

A plurality of sub-pixels SP1, SP2, and SP3 (configured to embody images) may be disposed in the display region A1.

The plurality of sub-pixels SP1, SP2, and SP3 may embody respective colors. For example, the sub-pixel SP1 may embody red color, the sub-pixel SP2 may embody green color, and the sub-pixel SP3 may embody blue color. Although not shown, in an implementation, the organic light emitting display apparatus 1 may further include a plurality of sub-pixels capable of embodying white color and other various colors.

Each of the sub-pixels SP1, SP2, and SP3 may be defined by a scan line S extending in one direction and data lines D1, D2, and D3 extending in a direction crossing the scan line S.

A first scan line S1 of the scan line S and a first data line D1 may be connected to the sub-pixel SP1. A second scan line S2 of the scan line S and a second data line D2 may be connected to the sub-pixel SP2. A second scan line SP2 of the scan line S and a third data line D3 may be connected to the sub-pixel SP3.

The first and second scan lines S1 and S2 may be connected in parallel to each other. For example, the first and second scan lines S1 and S2 may be branched from one scan line S. However, the embodiments are not limited thereto, and three scan lines may be branched from one scan line S.

As noted above, the first and second scan lines S1 and S2 are branched from one scan line S. Thus, the same signal may be applied to the first and second scan lines S1 and S2. As a result, the same scan signal may be applied to the sub-pixels SP1, SP2, and SP3, e.g., the sub-pixels SP1, SP2, and SP3 constituting one unit pixel.

The first, second, and third data lines D1, D2, and D3 may receive a data signal from a data driver (not shown) included in the non-display region A2, and may apply the data signal to each of the sub-pixels SP1, SP2, and SP3. Also, the scan line S may receive a scan signal from a scan driver (not shown) included in the non-display region A2 and apply the scan signal to each of the sub-pixels SP1, SP2, and SP3.

A power supply line V may be connected to each of the sub-pixels SP1, SP2, and SP3. The power supply line V may receive a voltage from a power driver (not shown) included in the non-display region A2, and may apply the voltage to each of the pixels P. Although not shown, in an implementation, a subsidiary power supply line (not shown) may be further disposed and reduce an electrical resistance of the power supply line V to prevent a voltage drop. The subsidiary power supply line may intersect the power supply line V and be electrically connected to the power supply line V.

Furthermore, an emission control line GC may be connected to the sub-pixels SP1, SP2, and SP3. The emission control line GC may receive control signals from a control signal driver (not shown) included in the non-display region A2 and may simultaneously apply the control signals having a predetermined voltage level to the respective sub-pixels SP1, SP2, and SP3. For example, the control signals may be simultaneously applied to all the sub-pixels SP1, SP2, and SP3 through the emission control line GC. To apply the control signals, the emission control lines GC may be connected in parallel to one another.

The emission control lines GC may control emission characteristics of the respective sub-pixels SP1, SP2, and SP3. For example, the emission control lines GC may be used to compensate threshold voltages for driving the sub-pixels SP1, SP2, and SP3.

FIG. 3 illustrates a schematic diagram of an interconnection structure of a region III of FIG. 1. The scan line S will now be described in detail with reference to FIG. 3.

FIG. 3 illustrates only one scan line S. Also, other conductive lines, e.g., data lines D1, D2, and D3 and emission control lines GC are omitted in FIG. 3 for brevity.

One scan line S may include a first scan line S1 and a second scan line S2 branched therefrom. Sub-pixels SP1 may be connected to the first scan line S1 and arranged in one direction (X direction). Sub-pixels SP2 and sub-pixels SP3 may be connected to the second scan line S2 and arranged in one direction (X direction).

Meanwhile, a first inspection thin film transistor (TFT) TR1 and a second inspection TFT TR2 may be formed in the first scan line S1. For example, the first inspection TFT TR1 and a second inspection TFT TR2 may be disposed outside the sub-pixels SP1 arranged in one direction (X direction).

Although FIG. 3 illustrates the first inspection TFT TR1 and the second inspection TFT TR2 formed in the first scan line S1, in an implementation, the first and second inspection TFTs TR1 and TR2 may be formed in the second scan line S2.

The first and second inspection TFTs TR1 and TR2 may be used to inspect electrical properties of the organic light emitting display apparatus 1. For example, the first and second inspection TFTs TR1 and TR2 may be used to inspect short failures between the scan line S and other conductive lines. This will be described in detail later.

Figure 4:
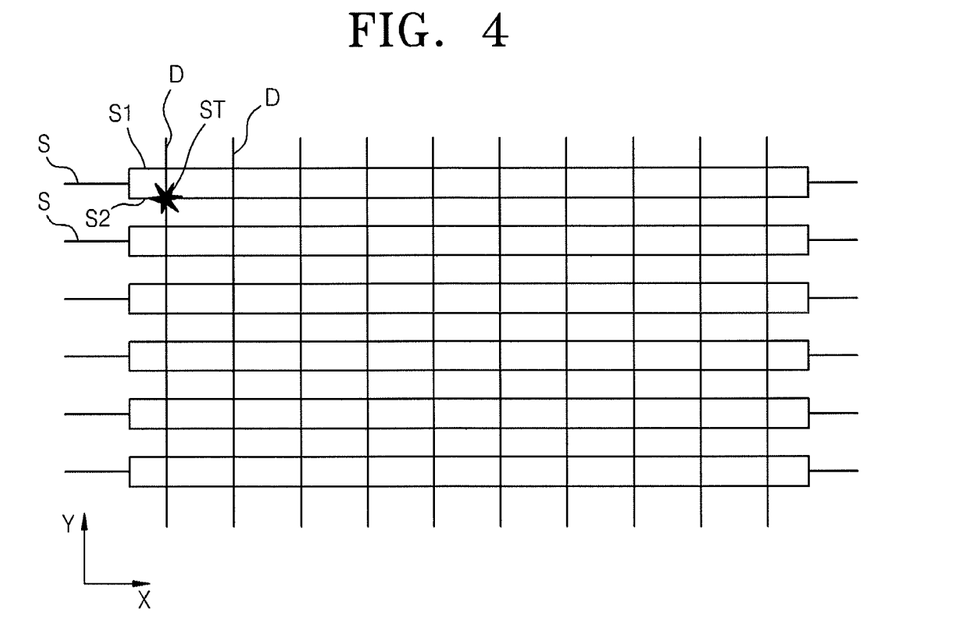
FIG. 4 illustrates a schematic diagram showing occurrence of a short failure in the organic light emitting display apparatus of FIG. 1.

FIG. 4 illustrates a schematic diagram showing occurrence of a short failure in the organic light emitting display apparatus of FIG. 1.

For example, FIG. 4 illustrates occurrence of a short failure ST in an overlap region between the second scan line S2 of an uppermost scan line S of the scan lines S and the data line D due to extraneous matters, such as particles. The data line D may be any one of the above-described first, second, and third data lines D1, D2, and D3.

To improve resolution characteristics of the organic light emitting display apparatus 1, a repair process may be performed on the short failure. To perform the repair process, a process for detecting a position of the short failure ST should be preceded.

Figure 5A:
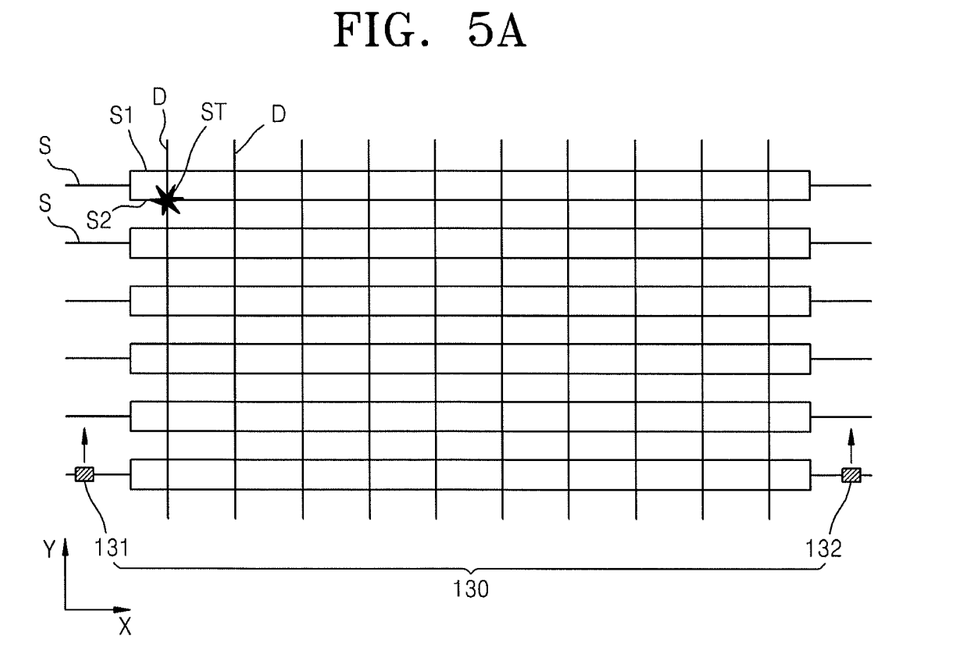
FIGS. 5A through 5C illustrate schematic diagrams of stages in a method of inspecting an organic light emitting display apparatus according to an embodiment.
Figure 5B:
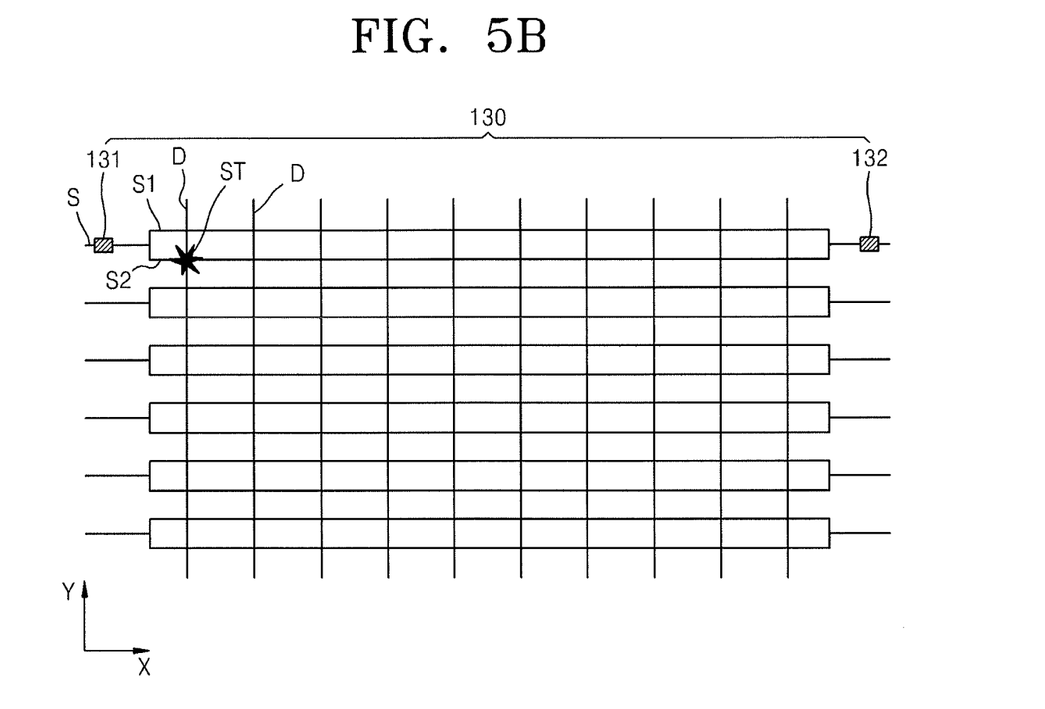
Figure 5C:
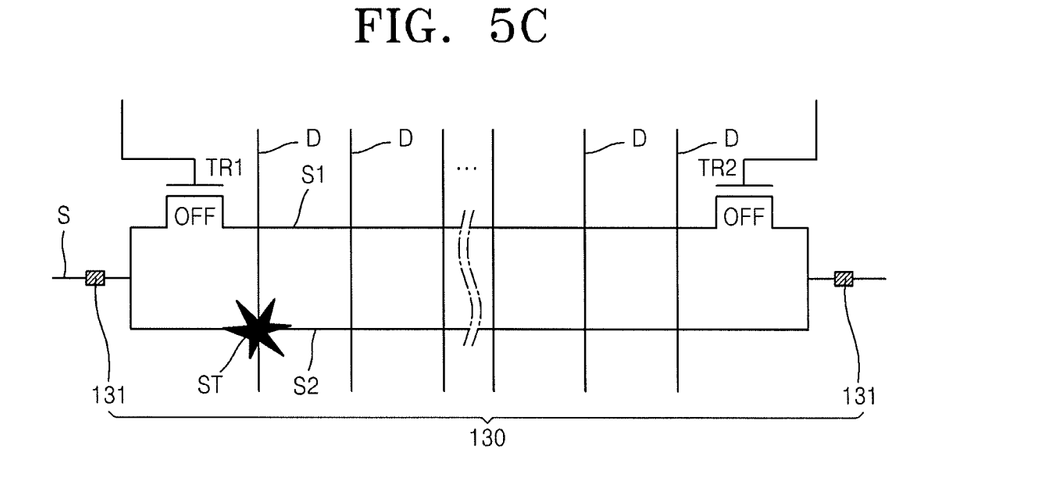

FIGS. 5A through 5C illustrate schematic diagrams of stages in a method of inspecting an organic light emitting display apparatus according to an embodiment.

Referring to FIG. 5A, an inspection apparatus 130 including a power supply member 131 and a power receiving member 132 may be prepared. Also, the power supply member 131 and the power receiving member 132 may be sequentially connected to each of scan lines S. Thereafter, when a voltage is applied to each of the scan lines using the power supply member 131 and the power receiving member 132, current may flow to the scan line S. For example, a potential difference may occur between both ends of the scan line S. The potential difference may be monitored.

By moving the power supply member 131 and the power receiving member 132 in the arrow direction shown in FIG. 5A and sequentially connecting the power supply member 131 and the power receiving member 132 to the scan line S, the short failure ST of the scan line S may be firstly inspected. For example, during the monitoring of potential differences between the respective scan lines S, each of measurements of normal scan lines S that do not cause short failures ST with the data line D may be different from a measurement of a scan line S that causes a short failure ST with the data line D as shown in FIG. 5B. The scan line S having the short failure S may be confirmed via the first inspection process.

During the first inspection process, voltages may be naturally applied to normally operate the first and second inspection TFTs TR1 and TR2 formed in the scan line S. For example, the first and second scan lines S1 and S2 of the scan line S may not remain floated.

Meanwhile, even if the first inspection process is performed, precise confirmation required for a repair process may be precluded. For example, as described above, the scan line S may include the first and second scan lines S1 and S2 that may be branched from the scan line S and connected in parallel to each other. Therefore, even if the scan line S having the short failure ST is confirmed via the first inspection process using the inspection apparatus 130, it may not be possible to discern which one of the first and second scan lines S1 and S2 of the scan line S causes the short failure ST with the data line D.

In the present embodiment, a second inspection process may be performed using the first and second inspection TFTs TR1 and TR2, and it may be confirmed which one of the first and second scan lines S1 and S2 causes the short failure ST with the data line D.

The second inspection process will now be described in detail.

To begin with, the operation of the first and second inspection TFTs TR1 and TR2 may be stopped as shown in FIG. 5C. For example, application of voltages to the first and second inspection TFTs TR1 and TR2 may be interrupted. Thus, the first scan line S1 of the scan line S may be isolated from the second scan line S2, e.g., may be floated.

Thereafter, the power supply member 131 and the power receiving member 132 of the inspection apparatus 130 may be connected to both ends of the scan line S, and voltages may be applied to the scan line S using the power supply member 131 and the power receiving power 132, and a potential difference between both the ends of the scan line S may be measured. As noted above, the first scan line S1 may be floated. Thus, the potential difference between both the ends of the scan line S may be substantially caused by the second scan line S2.

For example, as shown in FIG. 5C, when a potential difference measured when the first scan line S1 is floated by stopping the operation of the first and second inspection TFTs TR1 and TR2 (i.e., a potential difference measured using the second inspection process) is equal to a potential difference measured when the first scan line S1 is not floated but connected in parallel to the second scan line S2 (i.e., a potential difference measured using the first inspection process), it may be inferred that the short failure ST of the scan line S occurred in the second scan line S2 as shown in FIG. 5C.

However, when the potential difference measured when the first scan line S1 is floated by stopping the operation of the first and second inspection TFTs TR1 and TR2 (i.e., the potential difference measured using the second inspection process) is not equal to the potential difference measured when the first scan line S1 is not floated but connected in parallel to the second scan line S2 (i.e., a potential difference measured using the first inspection process), it may be inferred that the short failure ST of the scan line S occurred in the first scan line S1.

Thus, it may be easily confirmed which one of the first and second scan lines S1 and S2 connected in parallel caused the short failure ST with the data line D.

Therefore, in the present embodiment, the scan lines S may be sequentially inspected using the inspection apparatus 130, and it may be firstly confirmed which one of the scan lines S caused the short failure ST with the data line D via the first inspection process. Thereafter, to obtain more precise inspection results, the first scan line S1 may be floated by stopping the operation of the first and second inspection TFTs TR1 and TR2, and then it may be easily confirmed which one of the first and second scan lines S1 and S2 of the scan line S suffered the short failure ST via the second inspection process using the inspection apparatus 130.

As noted above, the first and second inspection TFTs TR1 and TR2 may be prepared for an inspection process. Thus, they may be disposed irrespective of the drive of the sub-pixels SP1, SP2, and SP3.

After the scan line S having the short failure ST was confirmed via the above-described inspection process, a repair process including a laser cutting process may be performed.

Although the present embodiment pertains to an example in which the first and second inspection TFTs TR1 and TR2 are disposed in any one of the first and second scan lines S1 and S2 connected in parallel, the embodiments are not limited thereto.

Figure 6:
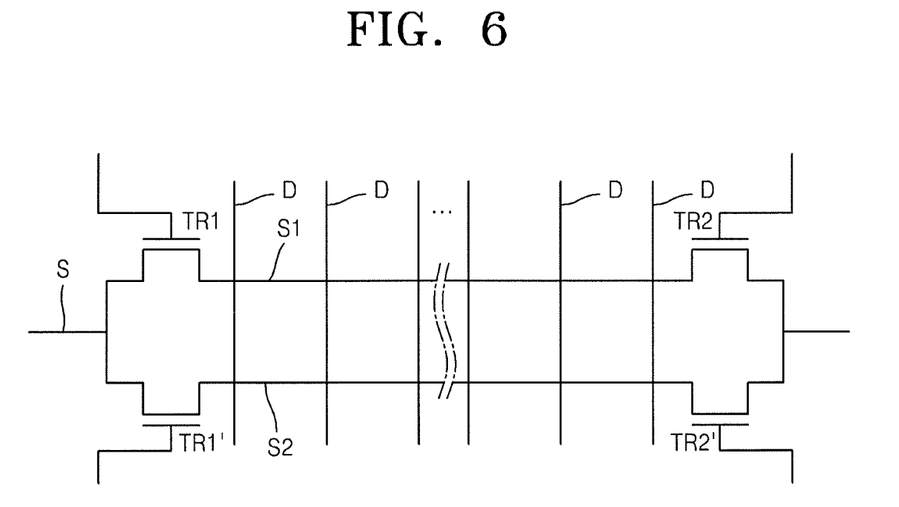
FIG. 6 illustrates a schematic diagram of an organic light emitting display apparatus according to another embodiment.

For example, as shown in FIG. 6, inspection TFTs may be disposed in both the first and second scan lines S1 and S2 of the scan line S. For example, first and second inspection TFTs TR1 and TR2 may be disposed in the first scan line S1, and first and second inspection TFTs TR1' and TR2' may be disposed in the second scan line S2.

Although the present embodiment pertains to an example in which the first and second inspection TFTs TR1 and TR2 are disposed in any one of the first and second scan lines S1 and S2 connected in parallel, the embodiments are not limited thereto. For example, the embodiments may be applied to other conductive lines connected in parallel.

Figure 7:
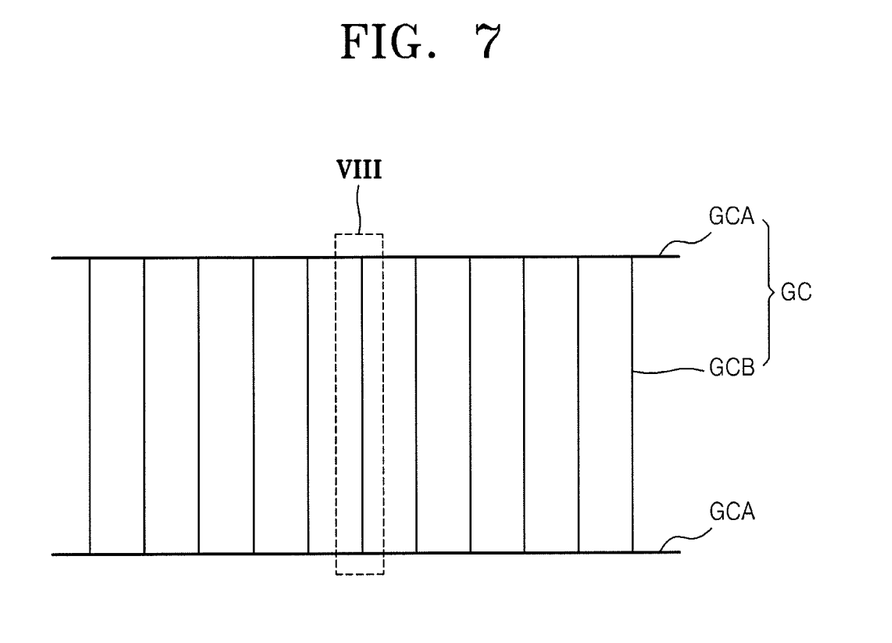
FIGS. 7 and 8 illustrate schematic diagrams of an organic light emitting display apparatus according to another embodiment.
Figure 8:
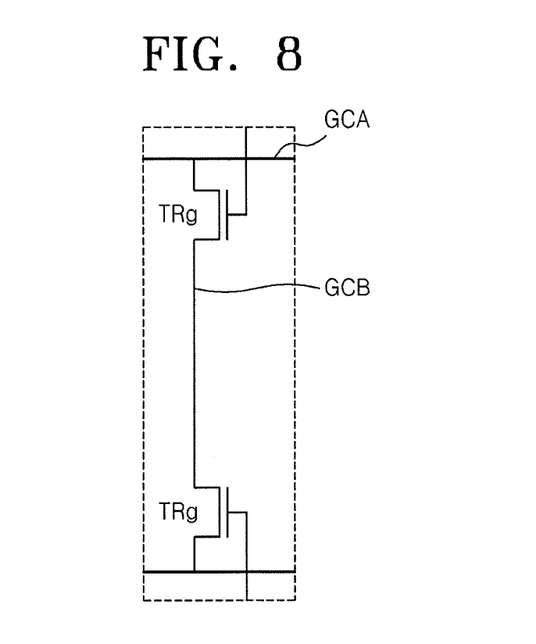

FIGS. 7 and 8 illustrate schematic diagrams of an organic light emitting display apparatus according to another embodiment. For brevity, other conductive lines are omitted and only an emission control line GC is illustrated.

The emission control line GC of FIG. 2, according to a specific embodiment, may be as shown in FIG. 7. For example, the emission control line GC may include common lines GCA and parallel control lines GCB connected in parallel to one another by the common lines GCA. Since functions and effects of the emission control line GC are the same as described in the foregoing embodiment, a detailed description thereof may be omitted.

In this case, inspection TFTs TRg may be disposed in at least one of the parallel control lines GCB as shown in FIG. 8.

Furthermore, by controlling the operation of the inspection TFTs TRg as described above, it may be easily confirmed which one of the parallel control lines GCB of the emission control line GC caused a short failure ST with another conductive line, e.g., a scan line S, a power line V, or a subsidiary power line (not shown).

Figure 9:
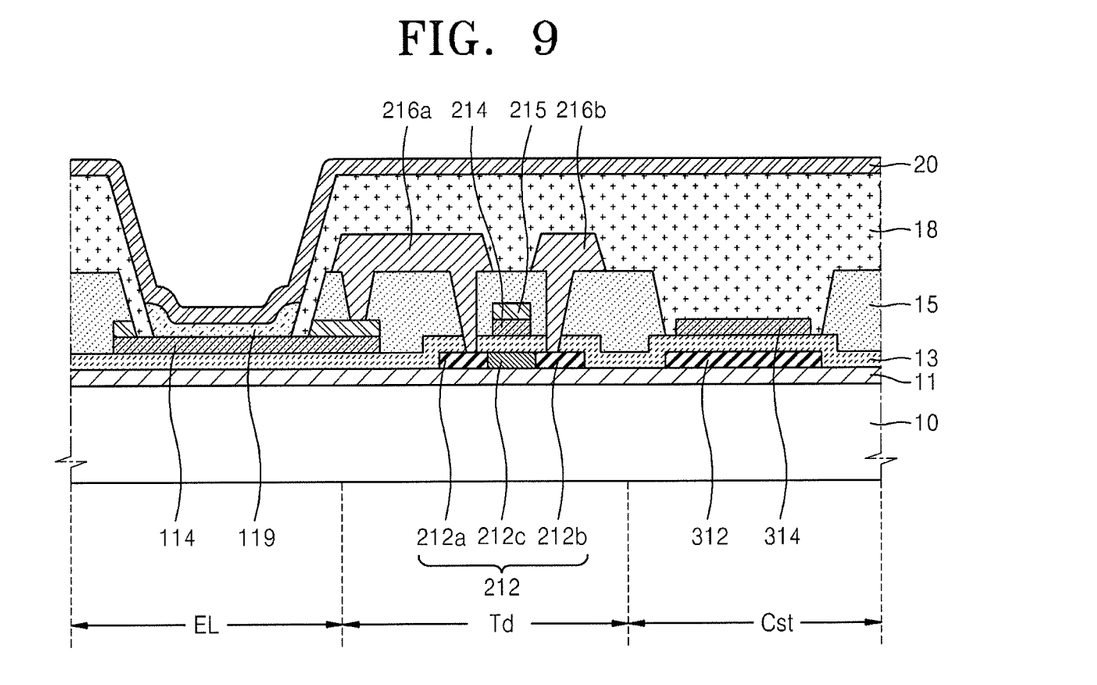
FIG. 9 illustrates a schematic cross-sectional view of some components of a sub-pixel of the organic light emitting display apparatus of FIG. 1.

FIG. 9 illustrates a schematic cross-sectional view of some components of a sub-pixel of the organic light emitting display apparatus of FIG. 1.

Referring to FIG. 9, a thin film transistor (TFT) Td, a capacitor Cst, and an organic light emitting device EL may be disposed on a substrate 10. The organic light emitting device EL may include a first electrode 114, a second electrode 20, and an intermediate layer 119, and the capacitor Cst may include a first capacitor electrode 312 and a second capacitor electrode 314.

Although not shown in FIG. 9, each of sub-pixels may further include additional TFTs and capacitors and various interconnections, such as a scan line S, a data line D, a power supply line V, and a control GC. However, only some components will be briefly described with reference to FIG. 9.

The substrate 10 may be formed of, e.g., a transparent glass containing $SiO_2$ as a main component. The substrate 10 is not limited thereto and may be formed of, e.g., a transparent plastic material.

A buffer layer 11 may be further formed on the substrate 10. The buffer layer 11 may provide a planar surface to a top surface of the substrate 10 and may help prevent diffusion of moisture and extraneous matters.

An active layer 212 of the TFT Td may be formed on the buffer layer 11. The active layer 212 may be formed of an inorganic semiconductor, such as amorphous silicon (a-Si) or polysilicon (poly-Si). In an implementation, the active layer 212 may be formed of an organic semiconductor, an oxide semiconductor, or various other materials. The active layer 212 may include a source region 212b, a drain region 212a, and a channel region 212c.

A gate insulating layer 13 may be formed on the active layer 212. A first gate electrode layer 214 and a second gate electrode layer 215 containing a transparent conductive material may be sequentially formed on the gate insulating layer 13 in a position corresponding to the channel region 212c of the active layer 212.

A source electrode 216b and a drain electrode 216a may be formed on the second gate electrode layer 215 and respectively connected to source and drain regions 212b and 212a of the active layer 212 via an interlayer insulating layer 15 therebetween.

A pixel defining layer 18 may be formed on the interlayer insulating layer 15 to cover the source and drain electrodes 216b and 216a.

In this case, the data line D may be formed in the same layer as the source electrode 216b or the drain electrode 216a using the same material as the source electrode 216b or the drain electrode 216a.

The scan line S may be formed in the same layer as the first gate electrode layer 214 or the second gate electrode layer 215 using the same material as the first gate electrode layer 214 or the second gate electrode layer 215.

A first electrode 114 may be formed on the buffer layer 11 and the gate insulating layer 13 using the same transparent conductive material as the first gate electrode layer 214. The transparent conductive material may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 119 including an organic emission layer (EML) may be formed on the first electrode 114.

The organic EML of the intermediate layer 119 may include an organic monomer or an organic polymer. When the organic EML includes the organic monomer, the intermediate layer 119 may include a hole transport layer (HTL), a hole injection layer (HIL), an electron transport layer (ETL), and an electron injection layer (EIL) in addition to the organic EML. In addition, various layers may be stacked as needed in the intermediate layer 119.

Meanwhile, when the organic EML includes the organic polymer, the intermediate layer 119 may include an HTL in addition to the organic EML.

A second electrode 20 serving as a common electrode may be formed on the intermediate layer 119. In the organic light emitting display apparatus according to the present embodiment, the first electrode 114 may be used as an anode, and the second electrode 20 may be used as a cathode. Conversely, the first electrode 114 may be used as the cathode, and the second electrode 20 may be used as the anode.

The second electrode 20 may include a reflective electrode including a reflective material. In this case, the second electrode 20 may include at least one material selected from the group of aluminum (Al), magnesium (Mg), lithium (Li), calcium (Ca), lithium fluoride/calcium (LiF/Ca), and LiF/Al.

A first capacitor electrode 312 of the capacitor Cst and a second capacitor electrode 314 of the capacitor Cst may be formed on the substrate 10 and the buffer layer 11. The first capacitor electrode 312 may be formed of the same material as the active layer 212 of the TFT Td, and the second capacitor electrode 314 may include a transparent conductive material formed of the same material as the first electrode 114. A gate insulating layer 13 may be disposed between the first and second capacitor electrodes 312 and 314.

Although not shown in FIG. 9, a sealing member (not shown) may be disposed over the second electrode 20 opposite one surface of the substrate 10. The sealing member may be formed to protect the intermediate layer 119 from external moisture or oxygen. The sealing member may be formed of glass or plastic or a multi-layered structure of organic and inorganic materials.

By way of summation and review, various kinds of conductive lines may be disposed to drive the organic light emitting display apparatus. The conductive lines may include conductive lines disposed in different layers and configured to overlap one another. When a short failure occurs in a region where conductive lines overlap each other, it may be necessary to repair the short failure.

However, it may not be easy to detect a position of the short failure between the overlapping conductive lines. For example, as the shapes of the conductive lines become complicated and the number of the conductive lines increases, there may be a specific limit to inspecting the organic light emitting display apparatus and detecting short failures.

The embodiments provide an organic light emitting display apparatus and a method of inspecting the same, by which electrical failures can be easily inspected.

For example, an organic light emitting display apparatus and a method of inspecting the same according to an embodiment may facilitate inspection of electrical failures.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus, comprising:
   a plurality of sub-pixels;
   a plurality of conductive line portions connected to the sub-pixels, the plurality of conductive line portions including at least two conductive lines connected in parallel to one another; and
   inspection thin film transistors (TFTs) disposed adjacent to at least one end of at least one conductive line of the conductive lines connected in parallel to one another.

2. The organic light emitting display apparatus of claim 1, wherein the plurality of conductive line portions are scan lines.

3. The organic light emitting display apparatus of claim 2, wherein each of the scan lines includes a first scan line and a second scan line branched from the corresponding scan line and connected in parallel to each other.

4. The organic light emitting display apparatus of claim 3, wherein a sub-pixel connected to the first scan line and sub-pixels connected to the second scan line embody different colors.

5. The organic light emitting display apparatus of claim 3, wherein any one of the first and second scan lines is connected to sub-pixels configured to embody one color and a sub-pixel configured to embody another color.

6. The organic light emitting display apparatus of claim 1, wherein each of the conductive line portions is an emission control line that simultaneously transmits a control signal to the sub-pixels.

7. The organic light emitting display apparatus of claim 6, wherein the emission control line includes a common line and parallel control lines connected to the common line and connected in parallel to one another.

8. The organic light emitting display apparatus of claim 1, wherein the inspection TFTs are disposed outside the sub-pixels.

9. The organic light emitting display apparatus of claim 1, wherein each of the sub-pixels includes a first electrode, an intermediate layer including an organic emission layer, and a second electrode, the organic light emitting display apparatus further comprising a TFT connected to the first electrode, the TFT applying a signal for driving the corresponding sub-pixel, and including an active layer, a gate electrode, a source electrode, and a drain electrode.

10. The organic light emitting display apparatus of claim 9, wherein the first electrode is formed of a same material as the gate electrode.

11. The organic light emitting display apparatus of claim 10, wherein the first electrode includes a transmissive conductive material.

12. The organic light emitting display apparatus of claim 1, wherein the inspection TFTs are controlled to be driven irrespective of the drive of the sub-pixels.

13. The organic light emitting display apparatus of claim 1, wherein the inspection TFTs are disposed adjacent to both ends of at least one conductive line of the conductive lines connected in parallel to one another.

14. A method of inspecting an organic light emitting display apparatus, the method comprising:
   preparing the organic light emitting display apparatus of claim 1;
   preparing an inspection apparatus including a power supply member and a power receiving member;
   performing a first inspection process, the first inspection process including sequentially connecting the power supply member and the power receiving member to the respective conductive line portions, applying electric signals to the respective conductive line portions, and monitoring the respective conductive line portions to confirm a conductive line portion having a failure out of the plurality of conductive line portions; and
   performing a second inspection process, the second inspection process including stopping the operation of the inspection TFTs of a conductive line portion having the failure, connecting the power supply member and the power receiving member to the conductive line portion having the failure, applying an electric signal to the conductive line portion having the failure to confirm a conductive line having a failure out of the conductive lines connected in parallel to each other in the conductive line portion.

15. The method of claim 14, wherein, in the second inspection process, the operation of the inspection TFTs is stopped such that the conductive line connected to the inspection TFTs of the conductive line portion having the failure remains floated.

16. The method of claim 14, wherein, in the first inspection process, the inspection TFTs normally operate.

17. The method of claim 14, wherein the failure of the conductive line portion is a short failure.

18. The method of claim 14, wherein the conductive line portions are scan lines, and the failure is a short failure between a scan line and a data line overlapping the scan line.

19. The method of claim 14, wherein the conductive line portions are emission control lines, and the failure is a short failure between an emission control line and a scan line or power line overlapping the emission control line.

20. The method of claim 14, further comprising repairing the conductive line having the failure that has been confirmed via the first and second inspection processes.

* * * * *